United States Patent
Lin et al.

(10) Patent No.: US 11,127,856 B2
(45) Date of Patent: Sep. 21, 2021

(54) LDMOS WITH DIODE COUPLED ISOLATION RING

(71) Applicant: NXP USA, Inc., Austin, TX (US)

(72) Inventors: Xin Lin, Phoenix, AZ (US); Zhihong Zhang, Chandler, AZ (US); Xu Cheng, Chandler, AZ (US); Ronghua Zhu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 23 days.

(21) Appl. No.: 16/379,765

(22) Filed: Apr. 9, 2019

(65) Prior Publication Data

US 2020/0328304 A1  Oct. 15, 2020

(51) Int. Cl.
  *H01L 29/78* (2006.01)
  *H01L 29/06* (2006.01)
  *H01L 29/10* (2006.01)
  *H01L 29/423* (2006.01)

(52) U.S. Cl.
  CPC ...... *H01L 29/7819* (2013.01); *H01L 29/0623* (2013.01); *H01L 29/0649* (2013.01); *H01L 29/1095* (2013.01); *H01L 29/42368* (2013.01); *H01L 29/7823* (2013.01)

(58) Field of Classification Search
  CPC ............. H01L 29/7819; H01L 29/0623; H01L 29/0649; H01L 29/1095; H01L 29/42368; H01L 29/7823; H01L 29/0878; H01L 29/086

USPC .................. 257/337, 335, 338; 438/294, 353
See application file for complete search history.

(56) References Cited

U.S. PATENT DOCUMENTS

| | | | |
|---|---|---|---|
| 9,236,472 B2 | 1/2016 | Chen et al. | |
| 9,559,097 B2 | 1/2017 | Parris et al. | |
| 9,680,011 B2 | 6/2017 | Zhang et al. | |
| 9,728,600 B2 | 8/2017 | Yang et al. | |
| 9,761,707 B1* | 9/2017 | Lin et al. | H01L 29/7823 |
| 2006/0011974 A1 | 1/2006 | Pendharkar | |
| 2013/0134511 A1 | 5/2013 | Yang et al. | |
| 2013/0270606 A1* | 10/2013 | Chen et al. | H01L 29/7823 257/183 |
| 2015/0295082 A1 | 10/2015 | Kim et al. | |

FOREIGN PATENT DOCUMENTS

| | | |
|---|---|---|
| EP | 2680299 A2 | 1/2014 |
| EP | 2731145 A2 | 5/2014 |

* cited by examiner

*Primary Examiner* — Thinh T Nguyen (57) ABSTRACT

A method for improving breakdown voltage of a Laterally Diffused Metal Oxide Semiconductor (LDMOS) includes biasing a first well of a Field Effect Transistor (FET) to a first voltage. The first well is laterally separated from a second well. An isolation ring is charged to a second voltage in response to the first voltage exceeding a breakdown voltage of a diode connected between the isolation ring and the first well. The isolation ring laterally surrounds the FET and contacts a buried layer (BL) extending below the first well and the second well. A substrate is biased to a third voltage being less than or equal to the first voltage. The substrate laterally extends below the BL and contacts the BL.

20 Claims, 12 Drawing Sheets

LDMOS WITH DIODE COUPLED ISOLATION RING

FIELD

This disclosure relates generally to high voltage semiconductor devices, and more specifically to a laterally diffused metal oxide semiconductor (LDMOS).

BACKGROUND

There have been increasing demands on integrated high voltage devices to operate at higher voltages in automotive, industrial and consumer applications. To achieve high side capability with an acceptable breakdown voltage, these devices can be surrounded by an isolation tub formed by n-type well implants on the sides of the devices and an n-type buried layer (NBL) extending beneath the devices. In such a design, a device breakdown voltage is usually limited by a vertical junction between the NBL and an isolated p-type well above it. For example, the breakdown voltage in an n-type LDMOS is generally determined by the junction between the body region and the NBL isolation layer underneath. Whereas, the junction formed by a p-type drift region and the NBL often determines the breakdown voltage in a p-type LDMOS.

For a conventional LDMOS, the device breakdown voltage can be improved by increasing an epitaxial layer thickness, however this would create a number of fabrication process challenges. For example, when the epitaxial layer thickness is increased, forming a robust electrical connection between the isolation ring and the NBL is more difficult, and a costly high-energy implanting tool may be required. In addition, increasing the epitaxial layer thickness could degrade the alignment accuracy or even cause alignment issues.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Various embodiments described herein provide for an LDMOS with an improved breakdown voltage by dynamically biasing an isolation tub. The isolation tub is formed by an isolation ring surrounding the LDMOS, and connected to a buried layer extending beneath the LDMOS. The isolation ring of the LDMOS is electrically coupled to an anode of an integrated diode. This diode is positioned outside the device operation area and is constructed by a p-plus active area and the n-type region (e.g., the body region in a p-type LDMOS and the drift region in an n-type LDMOS respectively, which is generally biased with a high potential during the device operation). Such a configuration lowers the potential on the isolation ring by a value equal to or larger than the diode breakdown voltage, which leads to an improvement in the breakdown voltage of the LDMOS. Biasing the isolation tub reduces a difference in potential between the buried layer and a well of the LDMOS vertically disposed above the buried layer, across a critical breakdown region. Other variations to the embodiments of the LDMOS described herein are realizable with similar diode coupling to the isolation ring.

Figure 1:
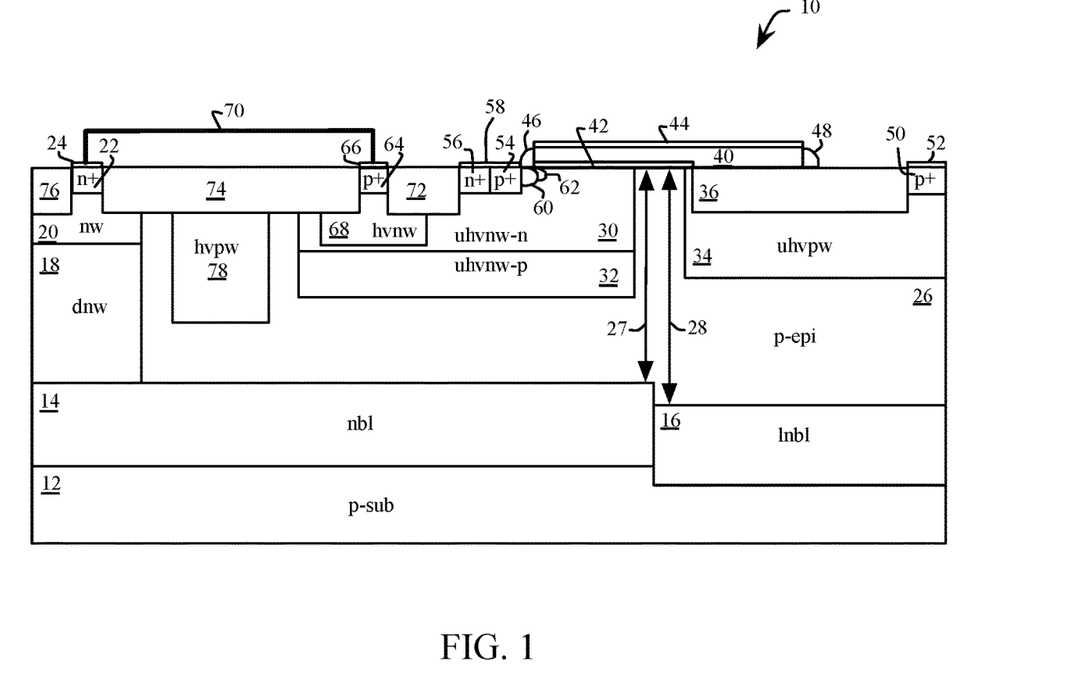
FIG. 1 is a cross-sectional view of a p-type LDMOS in accordance with an example embodiment of the present disclosure.

FIG. 1 shows an example embodiment 10 of a p-type LDMOS in accordance with the present disclosure. The embodiment 10 is formed on a p-type substrate 12. An N-type Buried Layer (NBL) 14 is formed over, and in contact with, the p-type substrate 12. In one embodiment, the p-type substrate 12 is grounded with a connection to a ground terminal, (not shown), and the NBL charges to a voltage equal to, or greater than ground. In the embodiment 10, a Lightly Doped NBL (LNBL) 16 is formed over, and in contact with a portion of the p-type substrate 12. An isolation ring is formed to surround a Field Effect Transistor (FET) of the embodiment 10, by forming a vertical structure including a deep n-well 18 on top of the NBL 14, and an n-well 20 on top of the deep n-well 18. The isolation ring together with the NBL 14 and LNBL 16 forms an isolation tub to enable high voltage operation. In one embodiment, rather than forming the LNBL 16, the NBL 14 extends the full width of the underlying p-type substrate 12. In another embodiment, a Deep Trench Isolation (DTI), (not shown), encloses the isolation ring to improve integration density.

An n-plus region 22, capped by a silicide 24, is formed on the n-well 20 to permit a low impedance connection to the isolation ring. A p-type epitaxial layer 26 is formed over the NBL 14 and the LNBL 16, wherein a first thickness 27 between the NBL 14 and a silicon surface proximal to the gate oxide of the NFET is less than a second thickness 28 between the LNLB 16 and the silicon surface. The body region of the FET is formed by a chain implant of an Ultra-High-Voltage N-Well (UHVNW), including an upper portion 30 (UHVNW-N) and a lower portion 32 (UHVNW-P). The lower portion 32 helps separate the body region, formed in part by the upper portion 30, from the isolation tub in the vertical direction, which enables a different bias on the body region from the isolation tub.

The drift region of the FET is formed by an Ultra-High-Voltage P-Well 34 (UHVPW). The LNBL 16 extends beneath the UHVPW 34. The region between the UHVPW 34 and the LNBL 16 forms a vertical junction, which is also a critical breakdown region of the FET. In various embodiments, the LNBL 16 is deeper and more lightly doped than the NBL 14, thus increasing the breakdown voltage across the vertical junction between the UHVPW 34 and the LNBL 16.

The drift region of the FET is further constrained by a Shallow Trench Isolation (STI) 36. A gate 40 is formed over a gate oxide 42, which extends across the body region and the drift region. The gate 40 is capped by a silicide 44 to facilitate a low impedance connection to the gate 40. Sidewall spacers 46 and 48 are formed on either side of the gate 40. The UHVPW 34 of the drift region is contacted by a p-plus region 50, capped by a silicide 52. In one embodiment, a drain terminal of the FET connects to the silicide 52.

A p-plus region 54, and an n-plus region 56 are each formed to contact the upper portion 30 of the body region, and to be capped by a silicide 58. In one embodiment, a source terminal of the FET connects to the p-plus region 54 and a body terminal of the FET connects to the n-plus region 56, wherein the source terminal and the body terminal are shorted together. In another embodiment, the source and body terminals are separated by an STI or other isolation scheme. In one embodiment, a P-type Lighted Doped Drain (PLDD) 60 and a p-type Extension (PEXT) 62 are formed adjacent to the p-plus region 54.

A p-plus region 64, capped by a silicide 66 is formed on a High-Voltage N-Well (HVNW) region 68, thereby forming a diode. Specifically, the p-plus region 64 forms the anode of the diode, and the HVNW region 68 forms the cathode of the diode. The HVNW region 68 prevents the depletion of the upper portion 30 by providing a greater n-type doping concentration adjacent to the p-plus region 64. In another embodiment, the HVNW region 68 is removed for simplicity, and the diode is formed with the p-type region 64 and the upper portion 30.

A metal interconnect 70 connects the silicide region 24 of the n-plus region 22 (e.g., the isolation tub), to the silicide region 66 of the p-plus region 64 (e.g., the anode). The diode formed by the p-plus region 64 and the HVNW region 68 is laterally displaced from the FET operating region (e.g., including in part, the n-plus region 56, the p-plus region 54 and the area under the gate 40), by an STI 72, which forms a lateral extension of the body region. An STI 74 separates the isolation ring, (e.g., formed in part by the n-plus region 22) from the diode (e.g., formed in part by the p-plus region 64). In one embodiment, an STI 76 is also formed beside the n-plus region 22.

A High-Voltage P-Well (HVPW) 78 provides further isolation of the body region, formed by the upper portion 30 from the isolation ring, because the body region and the isolation ring may operate at different potentials. In another embodiment, one or more of the STI regions 36, 72, 74 and 76 are replaced with a different isolation scheme, such as a silicide block layer.

Figure 2:
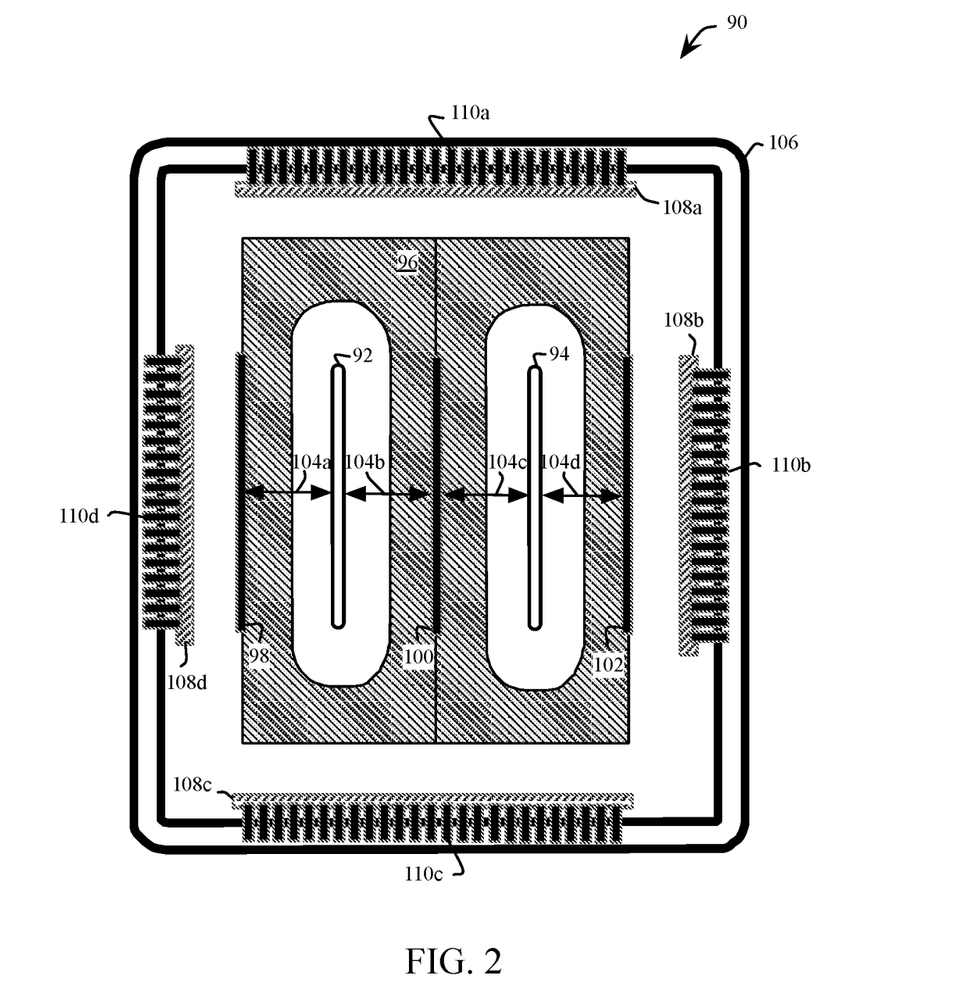
FIG. 2 is a partial plan view showing the placement of a subset of the mask layers of the LDMOS of FIG. 1.

FIG. 2 shows a partial plan view of FIG. 1 to further illustrate the relationship between the isolation ring, the diode and the FET device. The embodiment 90 includes a first drain 92 and a second drain 94. A source region 96 is connected to the source terminal with source contacts 98, 100 and 102. In one embodiment, each of the source contacts includes a body contact wherein each source contact is electrically shorted to the respective body contact. A first transistor 104a is formed between the source contact 98 and the first drain 92 with a first gate finger, (not shown). A second transistor 104b is formed between the source contact 100 and the first drain 92 with a second gate finger, (not shown). A third transistor 104c is formed between the source contact 100 and the second drain 94 with a third gate finger, (not shown). A fourth transistor 104d is formed between the source contact 102 and the second drain 94 with a fourth gate finger, (not shown).

An isolation ring 106 laterally surrounds the four transistors, 104a, 104b, 104c and 104d, (generally 104). The isolation ring 106 is connected to an anode of a diode formed by a respective p-plus region 108a, 108b, 108c and 108d, (generally 108), by a respective one of a plurality of metal interconnects 110a, 110b, 110c and 110d (generally 110). The total length of the p-plus region 108 scales with the device geometries (e.g., the width of the transistors 104, and the number of gate fingers), which enhances the response of the isolation ring to the body voltage.

Figure 3:
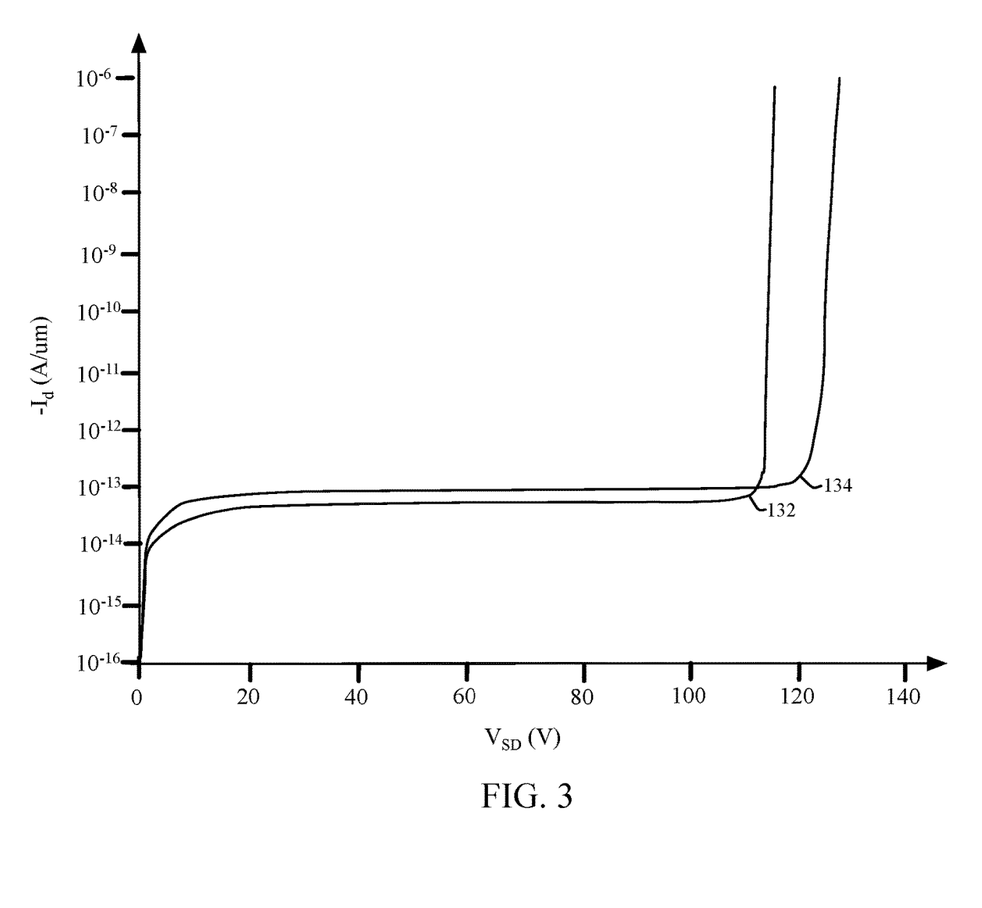
FIG. 3 is a graphical view showing Breakdown Voltage (BV) characteristics of a p-type LDMOS in an "off" state.
Figure 4:
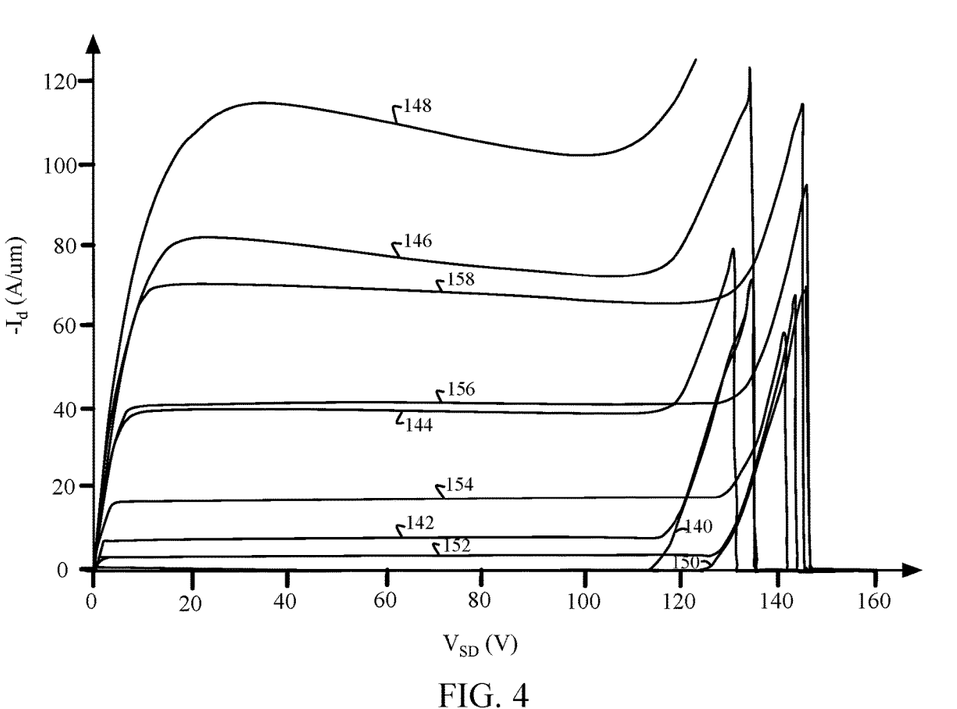
FIG. 4 is a graphical view showing BV characteristics of a p-type LDMOS in an "on" state.
Figure 5:
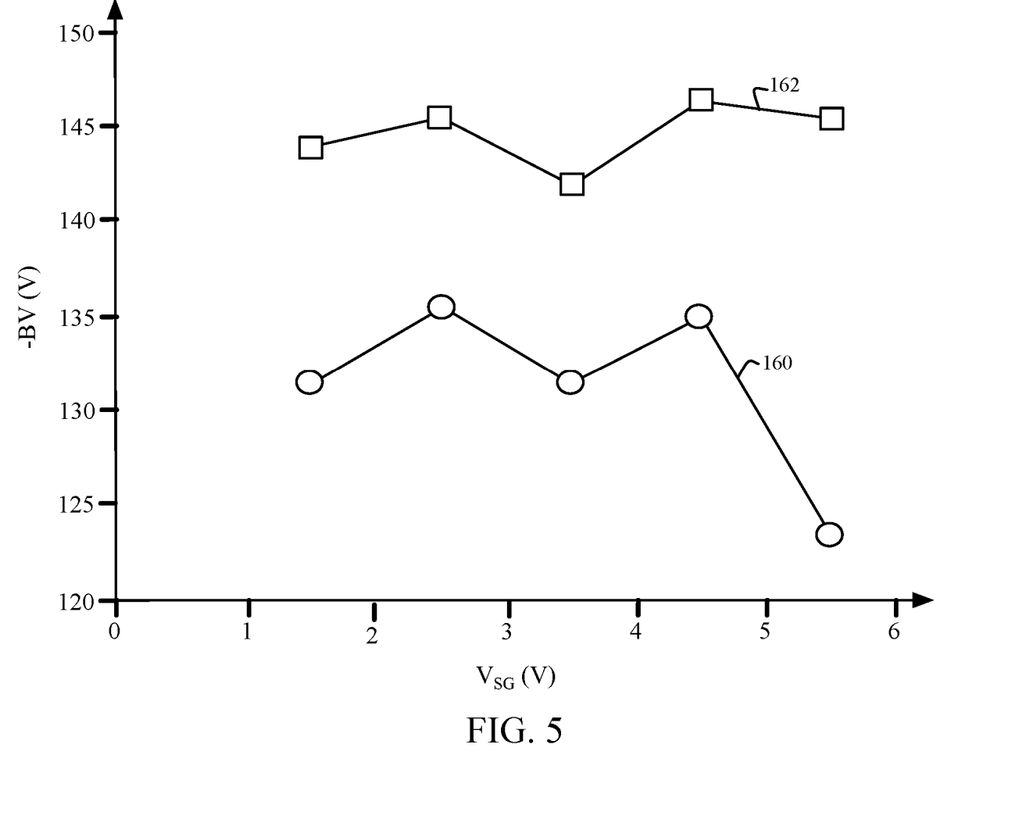
FIG. 5 is a graphical view comparing the Direct Current (DC) Safe Operation Area (SOA) of a conventional p-type LDMOS to the p-type LDMOS of FIG. 1.

FIG. 3, FIG. 4 and FIG. 5 show the breakdown characteristics of a p-type LDMOS improved by the present disclosure. FIG. 3 compares the I-V curves between a conventional structure 132 and the novel p-type LDMOS 134 having an integrated diode coupling the body potential to the isolation ring, (and thus the isolation tub). The I-V curves of FIG. 3 are measured in the "off" state, where gate is set to be equal to the source voltage (e.g., off), and the vertical axis represents the leakage current between the source and the drain. The I-V curves compare the drain current through an FET formed by the respective LDMOS structures, with a voltage drop measured across the source and drain terminals of the FET. As shown by FIG. 3, the I-V curve for the improved LDMOS 134 has a breakdown voltage of 126V, compared to 115V for the conventional structure 132, despite both structures having the same accumulation length, drift length, epitaxial layer 26, and similar polysilicon and metal stacks.

As shown with reference to FIG. 1 and FIG. 3, when a source voltage of 0V is applied to the body region through the p-plus region 54, the potential of the isolation tub is initially defined by the ground potential of the p-type substrate 12, and the p-type epitaxial layer 26 above the NBL 14. In other embodiments, the p-type substrate 12 is biased to a low reference being less than, or equal to, the lowest voltage applied to the body region. As the potential of the body region is raised, the voltage difference between the HVNW region 68 and the p-plus region 64 reaches or exceeds the reverse breakdown voltage of the diode formed therein, thus causing the potential of the isolation tub to be maintained within one reverse diode drop of the body potential until the vertical junction between the LNBL 16 and the UHVPW drift region 34 breaks down. Consequently, the novel device exhibits a higher breakdown voltage equivalent to the reverse diode breakdown voltage formed by the p-plus region 64 and the HVNW region 68. Due to a lower threshold voltage of the novel LDMOS 134, the device has a slightly higher leakage current than the conventional LDMOS 132. The lower threshold voltage of the novel LDMOS 134 is attributed to different heavily doped shallow implants disposed in the channel region at the source side.

In contrast to FIG. 3, which shows the I-V characteristics of an LDMOS in the "off" state, FIG. 4 shows the I-V characteristics in the "on" state, where the gate 40 is biased to form a channel between the source and drain. In FIG. 4, the curves 140, 142, 144, 146 and 148 are plotted for increasing absolute values of the gate bias for a conventional LDMOS. The curves 150, 152, 154, 156 and 158 are plotted for increasing values of the gate bias for the novel LDMOS, showing a higher breakdown voltage for each curve in comparison to the corresponding curve for the conventional LDMOS.

FIG. 5 shows the DC SOA of FIG. 4 for a conventional LDMOS 160 compared to the novel LDMOS 162. For example, with reference to both FIG. 4 and FIG. 5, the curve 146 in FIG. 4 for a conventional LDMOS, shows a peak current occurring at 135V, just prior to the breakdown of the vertical junction, similarly plotted on curve 160 of FIG. 5. The novel device exhibits an improved DC SOA especially at high gate voltages. The "on" state breakdown voltage also becomes less sensitive to the gate potential.

Figure 6:
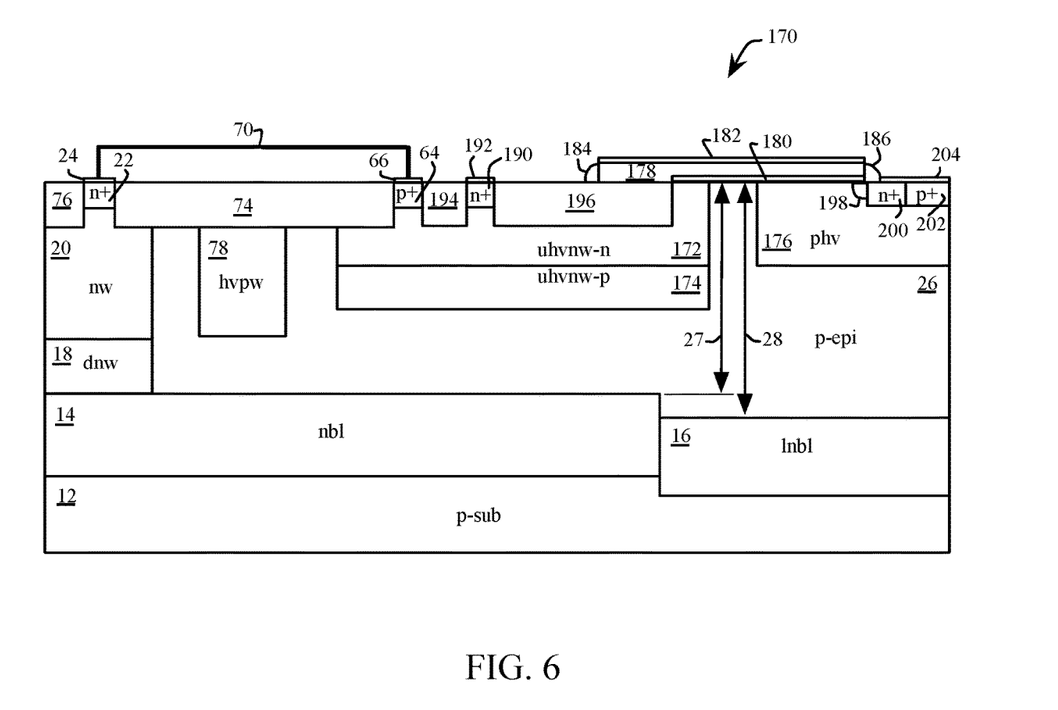
FIG. 6 is a cross-sectional view of an n-type LDMOS in accordance with an example embodiment of the present disclosure.

FIG. 6, with ongoing reference to FIG. 1, shows another example embodiment 170 of an n-type LDMOS in accordance with the present disclosure. The isolation tub, the p-type epitaxial layer, the anode of the diode and connection thereto of FIG. 1 and FIG. 6 are the same. Hence for brevity, their description will not be repeated. While the elements between FIG. 1 and FIG. 6 having the same element numbers are functionally similar, it should be understood that the order in which these elements are formed is not implied by FIG. 1 or FIG. 6.

A drift region of the embodiment 170 is formed by a chain implant of a UHVNW, including an upper portion 172 (UHVNW-N) and a lower portion 174 (UHVNW-P). The lower portion 174 helps separate the drift region, formed in part by the upper portion 172, from the isolation tub in the vertical direction, which enables a different bias on the drift region from the isolation tub. In one embodiment, the lower portion 174 is a Reduced Surface Field (RESURF) region.

A body region of the embodiment 170 is formed by a P-type High Voltage (PHV) implant 176. The LNBL 16 extends beneath the PHV 176. The region between the PHV 176 and the LNBL 16 forms a vertical junction, which is also a critical breakdown region of an n-type FET formed by the n-type LDMOS. In various embodiments, the LNBL 16 is deeper and more lightly doped than the NBL 14, thus increasing the breakdown voltage across the vertical junction between the PHV 176 and the LNBL 16. In another embodiment, the NBL 14 extends across the full width of the p-type substrate 12 and an LNBL 16 is not formed.

A gate 178 is formed over a gate oxide 180, which extends across an accumulation region and the body region. The gate 178 is capped by a silicide 182 to facilitate a low impedance connection to the gate 178. Sidewall spacers 184 and 186 are formed on either side of the gate 178. The upper portion 172 of the drift region is contacted by an n-plus region 190, capped by a silicide 192, and separated from the p-plus region 64 (e.g., the anode), by an STI 194. In one embodiment, a drain terminal of the n-type FET connects to the silicide 192. The drift region of the n-type FET is further constrained by a Shallow Trench Isolation (STI) 196.

A High-Voltage N-type Lightly Doped Drain (HVNLDD) implant 198 is formed adjacent to an n-plus region 200. The n-plus region 200 is adjacent to a p-plus region 202. A silicide extends across the n-plus region 200 and the p-plus region 202 to form a low impedance connection. In one embodiment, a source terminal of the n-type FET connects to the n-plus region 200 and a body terminal of the n-type FET connects to the p-plus region 202, wherein the source terminal and the body terminal are shorted together. In another embodiment, the source and body terminals are separated by an STI or other isolation scheme. In another embodiment, one or more of the STI regions 74, 76, 194 and 196 are replaced with a different isolation scheme, such as a silicide block layer. In another embodiment, a Deep Trench Isolation (DTI) (not shown) encloses the isolation ring to improve integration density.

Figure 7:
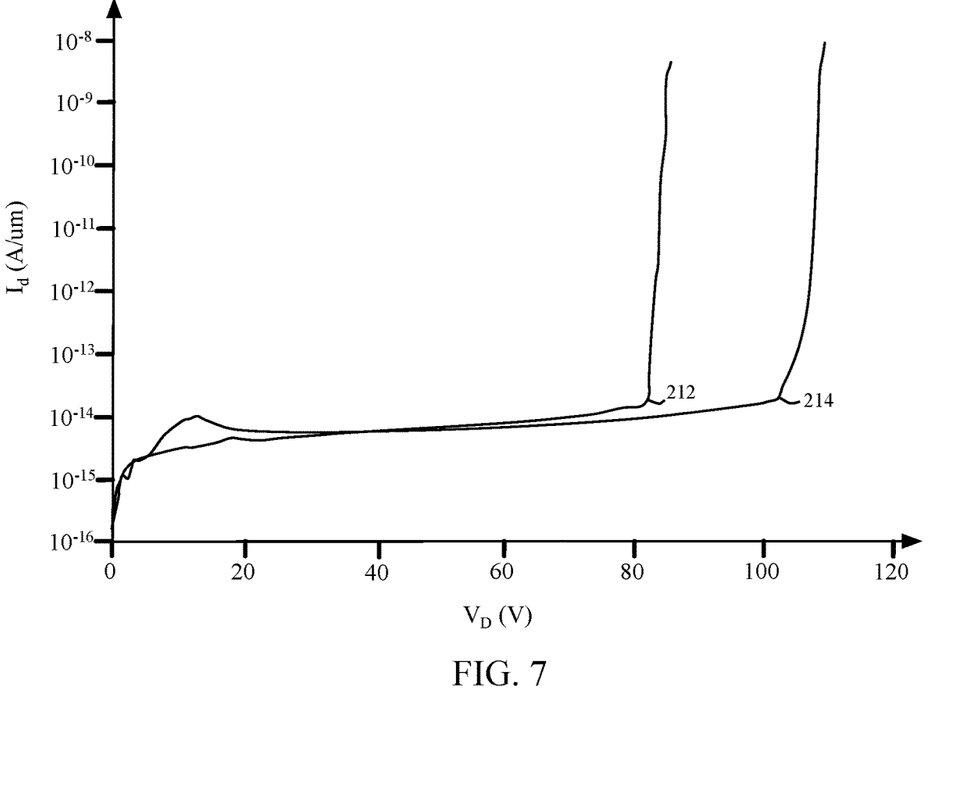
FIG. 7 is a graphical view showing BV characteristics of an n-type LDMOS in an "off" state.
Figure 9:
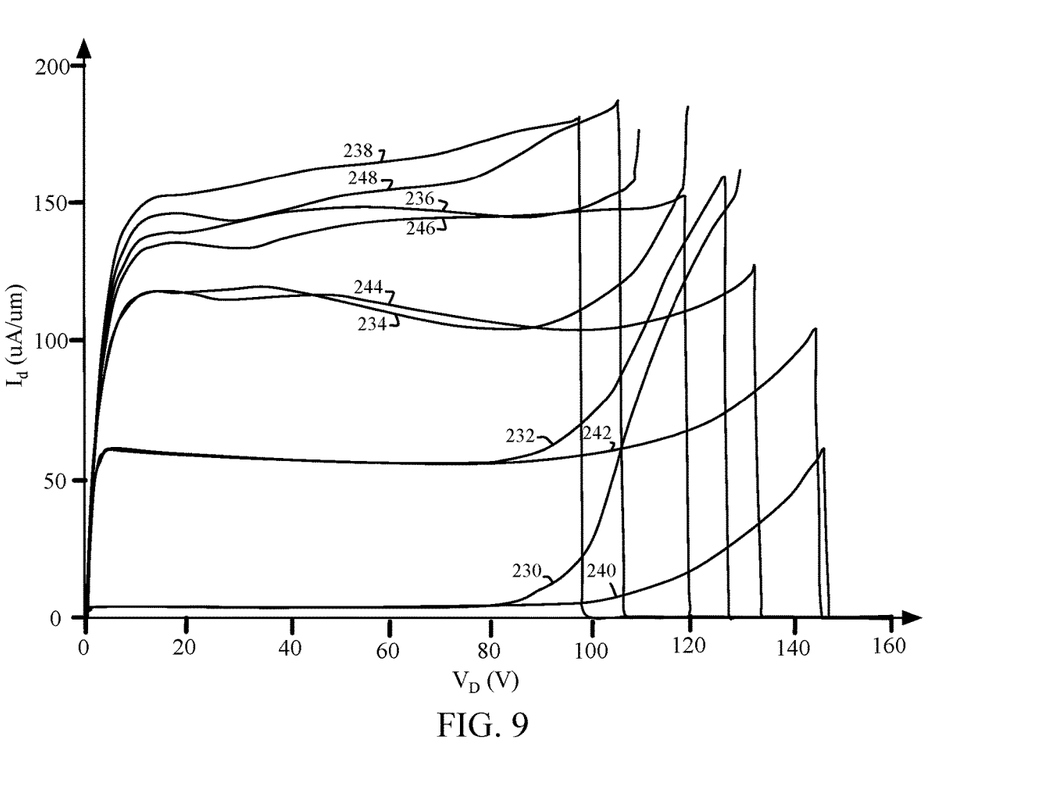
FIG. 9 is a graphical view showing BV characteristics of an n-type LDMOS in an "on" state.
Figure 10:
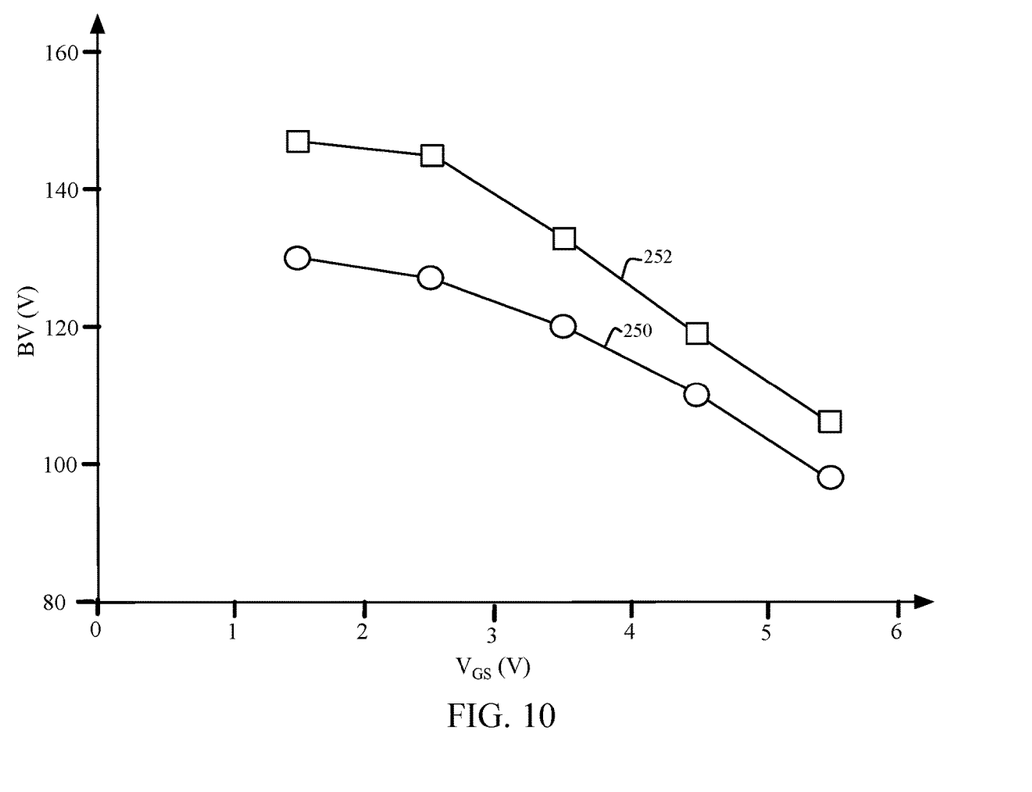
FIG. 10 is a graphical view comparing the DC SOA of a conventional n-type LDMOS to the n-type LDMOS of FIG. 6.

FIG. 7, FIG. 9, and FIG. 10 show the breakdown characteristics of an n-type LDMOS improved by the present disclosure. FIG. 7 compares the I-V curves between a conventional structure 212 and the n-type LDMOS 214 having an integrated diode coupling the drain potential to the isolation ring. The I-V curves of FIG. 7 are measured in the "off" state, where the gate is set to be equal to the source voltage (e.g., off), and the vertical axis represents the leakage current between the source and the drain. The I-V curves compare the drain current through an FET formed by the respective LDMOS structures, with a voltage drop measured across the source and drain terminals of the FET. As shown by FIG. 7, the I-V curve for the improved LDMOS 214 has a breakdown voltage of 108V, compared to 85V for the conventional structure 212, despite both structures having the same accumulation length, drift length, epitaxial layer 26, and similar polysilicon and metal stacks.

As shown with reference to FIG. 6 and FIG. 7, when a drain voltage applied to the drift region through the n-plus region 190 is initially at 0V, the potential of the isolation tub is initially defined by the ground potential of the p-type substrate 12, and the p-type epitaxial layer 26 above the NBL 14. In other embodiments, the p-type substrate 12 is biased to a low reference being less than or equal to the lowest voltage applied to the drain region. As the potential of the drift region is raised, the voltage difference between the upper portion 172 and the p-plus region 64 reaches or exceeds the reverse breakdown voltage of the diode formed therein, thus causing the potential of the isolation tub to be maintained within one reverse diode drop of the drift region potential until the vertical junction between the LNBL 16 and the PHV body region 176 breaks down. Consequently, the novel device exhibits a higher breakdown voltage equivalent to, or higher than, the reverse diode breakdown voltage formed by the p-plus region 64 and the upper portion 172.

At a moderate bias of the drift region, the isolation ring maintains a voltage equal to the drift region reduced by the reverse diode breakdown voltage. However, when the bias of the drift region has a high bias, yet low enough to prevent the breakdown of the vertical junction, the n-type region of the upper portion 172, between the drain contact, (formed by n-plus region 190) and the anode (e.g., the p-plus region 64), is depleted by the adjacent p-type regions. Accordingly, an additional voltage drop occurs between the drain contact and the anode, thereby further improving the device breakdown voltage across the vertical junction.

Figure 8:
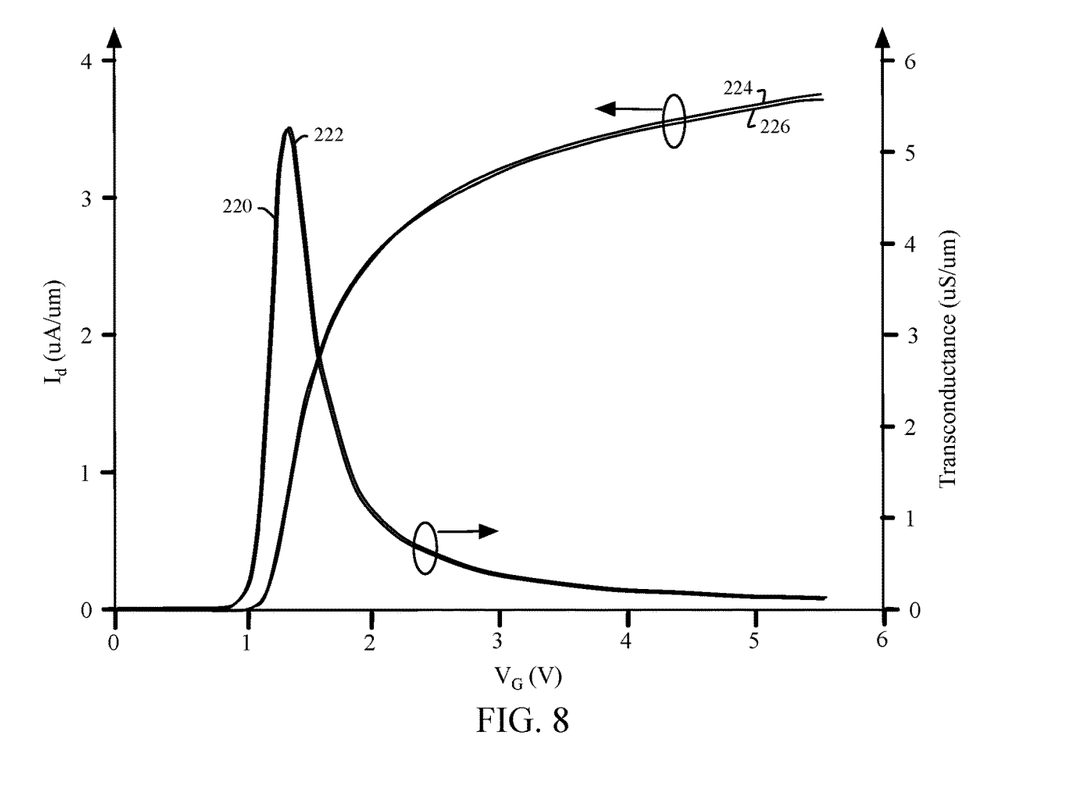
FIG. 8 is a graphical view showing the impact of drain current on the left axis, and transconductance on the right axis, comparing a conventional n-type LDMOS to the n-type LDMOS of FIG. 6.

FIG. 8 compares the transconductance for a conventional n-type LDMOS 220 with the novel n-type LDMOS 222 shown on the right axis. FIG. 8 further compares the drain current for a conventional n-type LDMOS 224 with the novel n-type LDMOS 226 shown on the left axis. Both the drain current comparison and the transconductance comparison show that the "on" resistance from drain to source (e.g., RDSon), is not affected by the bias configuration of the isolation ring.

In contrast to FIG. 8, showing the I-V characteristics of an LDMOS in the "off" state, FIG. 9 shows the I-V characteristics in the "on" state, where the gate 178 is biased to form a channel between the source and drain. In FIG. 9, the curves 230, 232, 234, 236 and 238 are plotted for increasing values of the gate bias for a conventional LDMOS. The curves 240, 242, 244, 246 and 248 are plotted for increasing values of the gate bias for the novel LDMOS, showing a higher breakdown voltage for each curve in comparison to the corresponding curve for the conventional LDMOS.

FIG. 10 shows the DC SOA of FIG. 9 for a conventional LDMOS 250 compared to the novel LDMOS 252. For example, with reference to both FIG. 9 and FIG. 10, the curve 240 in FIG. 9 for the novel LDMOS, shows a peak current occurring at 147V, just prior to the breakdown of the vertical junction, similarly plotted on curve 252 of FIG. 10.

Figure 11:
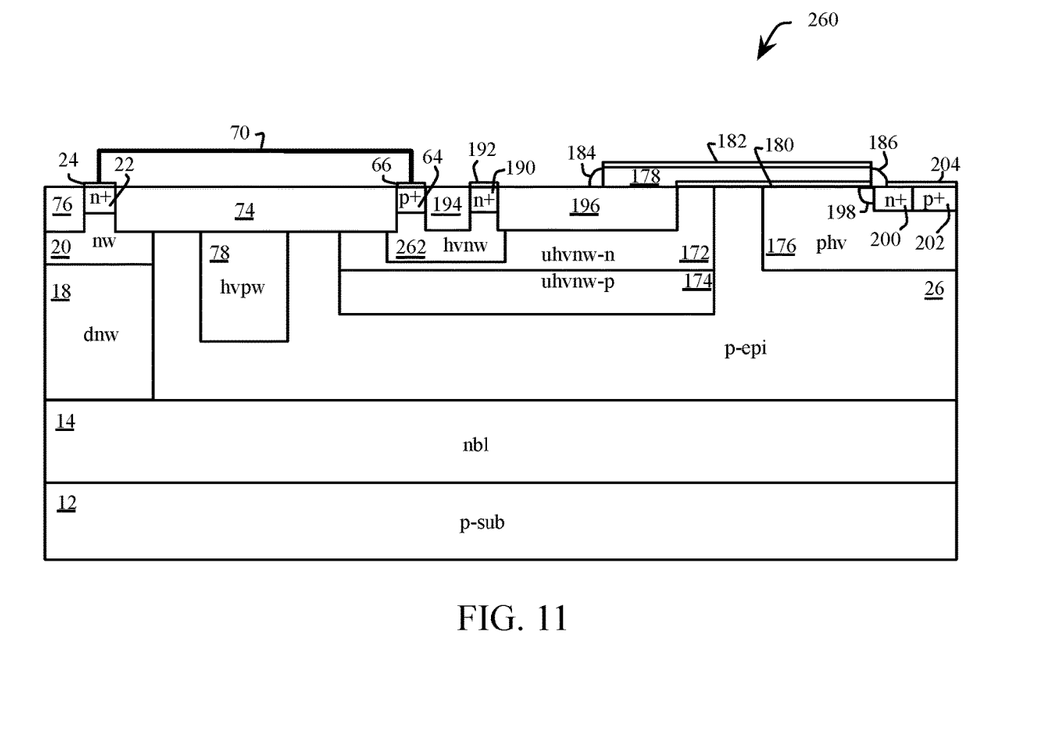
FIG. 11 is a cross-sectional view of an n-type LDMOS in accordance with an example embodiment of the present disclosure.

FIG. 11, with ongoing reference to FIG. 6, shows another embodiment 260 of an n-type LDMOS in accordance with the present disclosure. The Kirk effect is known to deteriorate the SOA in many n-type LDMOS devices. To mitigate this problem, a heavier doped n-type well implant HVNW 262 is added in the drain active area in some embodiments. FIG. 11 illustrates the cross-section of an n-type LDMOS with the HVNW 262 implemented in the drain active region, and also around the p-plus region 64 and in the area between the drain contact, (n-plus region 190), and the anode, (p-plus region 64). In this embodiment 260, depletion no long occurs along the n-type region between the drain contact and the anode, as was the case with the embodiment 170 of FIG. 6. Consequently, the potential of the isolation ring is less than the drain voltage by a constant value equal to the diode reverse breakdown voltage. In this embodiment, the FET is isolated from the neighboring circuitry by the NBL 14. In other embodiments, the LNBL 16 as shown in FIG. 6, or combination of the NBL 14 and LNBL 16 is used to form the isolation tub.

Figure 12:
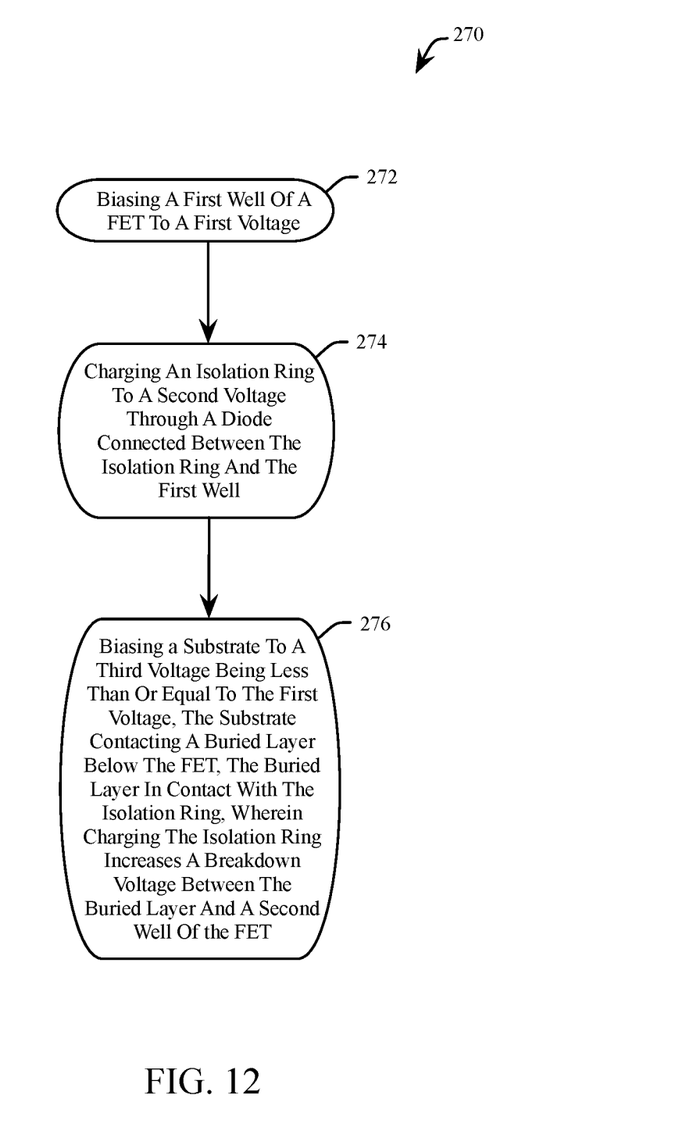
FIG. 12 is a flowchart representation of a method for improving breakdown voltage of an LDMOS in accordance with an example embodiment of the present disclosure.

FIG. 12 shows a method 270 for improving the breakdown voltage of an LDMOS, in accordance with the present disclosure. At 272, a first well of a FET is biased to a first voltage. In one example embodiment, the first well is the upper portion 30 of the body region of a p-type FET in FIG. 1, or the upper portion 172 of the drift region of an n-type FET in FIG. 6. At 274, an isolation ring is charged to a second voltage through a diode connected between the isolation ring and the first well. The diode is formed by the p-plus region 64 and HVNW region 68 of FIG. 1, or by the p-plus region 64 and the upper portion 172 of FIG. 6. At 276, a substrate 12 is biased to a third voltage being less than or equal to the first voltage. The substrate 12 contacts a buried layer NBL 14 and LNBL 16 below the FET. The buried layer 14 contacts the isolation ring, (e.g., formed in part by 18 and 20). The isolation ring increases a breakdown voltage between the buried layer LNBL 16 and a second well of the FET. In one example embodiment, the second well is the UHVPW region 34 of the drift region of a p-type FET in FIG. 1, or the PHV region 176 of the body region of an n-type FET in FIG. 6.

As will be appreciated, embodiments as disclosed include at least the following. In one embodiment, an LDMOS comprises a FET comprising a source terminal, a body terminal connected to a body region, and a drain terminal connected to a drift region. The body region is laterally separated from the drift region. An isolation ring is disposed to laterally surround the FET. A buried layer (BL) is below the FET and in contact with the isolation ring. A diode comprises an anode and a cathode. The anode is electrically coupled to the isolation ring and the cathode is electrically coupled to a region of the FET.

Alternative embodiments of the LDMOS include one of the following features, or any combination thereof. The FET is a p-type FET, and the region of the FET is the body region. The FET is an n-type FET, and the region of the FET is the drift region. The region of the FET comprises an upper portion formed by an n-type well implant, and a lower portion formed by a p-type well implant is disposed between the upper portion and the BL. An n-type implant is formed in the cathode, wherein the n-type implant has a higher doping concentration than an upper portion of the region of the FET. The BL comprises a first portion below the region of the FET and a second portion below the region of the FET, wherein the second portion has a lower doping concentration relative to the first portion. A first thickness between the first portion and a silicon surface proximal to a gate oxide of the FET is less than a second thickness between the second portion and the silicon surface. A deep trench isolation is disposed to laterally surround the isolation ring. A p-type implant is disposed between the body region and the isolation ring.

In another embodiment, an LDMOS comprises a FET comprising a source terminal, a body terminal connected to a body region, and a drain terminal connected to a drift region. An isolation ring is disposed to laterally surround the FET. A BL is below the FET and in contact with the isolation ring. A diode comprises an anode and a cathode. The anode is electrically coupled to the isolation ring with a metal interconnect and the cathode is electrically coupled to a region of the FET.

Alternative embodiments of the LDMOS include one of the following features, or any combination thereof. The region of the FET comprises an upper portion formed by an n-type well implant, and a lower portion formed by a p-type well implant is disposed between the upper portion and the BL. An n-type implant is formed in the cathode, wherein the n-type implant has a higher doping concentration than the region of the FET. The BL comprises a first portion below the region of the FET and a second portion below the region of the FET, wherein the second portion has a lower doping concentration relative to the first portion. A first thickness between the first portion and a silicon surface proximal to a gate oxide of the FET is less than a second thickness between the second portion and the silicon surface. A deep trench isolation is disposed to laterally surround the isolation ring. A p-type implant is disposed between the body region and the isolation ring.

In another embodiment, a method for improving breakdown voltage of an LDMOS comprises biasing a first well of a FET to a first voltage. The first well is laterally separated from a second well. An isolation ring is charged to a second voltage in response to the first voltage exceeding a breakdown voltage of a diode connected between the isolation ring and the first well. The isolation ring laterally surrounds the FET and contacts a BL extending below the first well and the second well. A substrate is biased to a third voltage being less than or equal to the first voltage. The substrate laterally extends below the BL and contacts the BL.

Alternative embodiments of the method for improving breakdown voltage of an LDMOS include one of the following features, or any combination thereof. The FET is a PFET, the first well is a body region of the PFET, the second well is a drift region of the PFET, and charging the isolation ring to the second voltage increases a PFET breakdown voltage across a vertical junction between the BL and the drift region. The FET is an NFET, the first well is a drift region of the NFET, the second well is a body region of the NFET, and charging the isolation ring to the second voltage increases an NFET breakdown voltage across a vertical junction between the BL and the body region.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A Laterally Diffused Metal Oxide Semiconductor (LDMOS) comprising:
    a Field Effect Transistor (FET) comprising a source terminal, a body terminal connected to a body region, and a drain terminal connected to a drift region, the body region laterally separated from the drift region;
    an isolation ring disposed to laterally surround the FET;
    a buried layer (BL) below the FET and in contact with the isolation ring; and
    a diode comprising an anode and a cathode, a junction is located between the anode and the cathode, the anode electrically coupled to the isolation ring from an anode side of the junction and the cathode electrically coupled to a region of the FET from a cathode side of the junction.

2. The LDMOS of claim 1 wherein the FET is a p-type FET, and the region of the FET is the body region.

3. The LDMOS of claim 1 wherein the FET is an n-type FET, and the region of the FET is the drift region.

4. The LDMOS of claim 1 wherein the region of the FET comprises an upper portion formed by an n-type well implant, and a lower portion formed by a p-type well implant is disposed between the upper portion and the BL.

5. The LDMOS of claim 4 wherein an n-type implant is formed in the cathode, wherein the n-type implant has a higher doping concentration than an upper portion of the region of the FET.

6. The LDMOS of claim 1 wherein the BL comprises a first portion below the region of the FET and a second portion below the region of the FET, wherein the second portion has a lower doping concentration relative to the first portion.

7. The LDMOS of claim 6 wherein a first thickness between the first portion and a silicon surface proximal to a gate oxide of the FET is less than a second thickness between the second portion and the silicon surface.

8. The LDMOS of claim 1 further comprising a deep trench isolation disposed to laterally surround the isolation ring.

9. A Laterally Diffused Metal Oxide Semiconductor (LDMOS) comprising:
    a Field Effect Transistor (FET) comprising a source terminal, a body terminal connected to a body region, and a drain terminal connected to a drift region;
    an isolation ring disposed to laterally surround the FET;
    a buried layer (BL) below the FET and in contact with the isolation ring; and
    a diode comprising an anode and a cathode, the anode electrically coupled to the isolation ring with a metal interconnect and the cathode electrically coupled to a region of the FET.

10. The LDMOS of claim 9 wherein the FET is a p-type FET and the region of the FET is the body region.

11. The LDMOS of claim 9 wherein the FET is an n-type FET and the region of the FET is the drift region.

12. The LDMOS of claim 9 wherein the region of the FET comprises an upper portion formed by an n-type well implant, and a lower portion formed by a p-type well implant is disposed between the upper portion and the BL.

13. The LDMOS of claim 12 wherein an n-type implant is formed in the cathode, wherein the n-type implant has a higher doping concentration than the region of the FET.

14. The LDMOS of claim 9 wherein the BL comprises a first portion below the region of the FET and a second portion below the region of the FET, wherein the second portion has a lower doping concentration relative to the first portion.

15. The LDMOS of claim 14 wherein a first thickness between the first portion and a silicon surface proximal to a gate oxide of the FET is less than a second thickness between the second portion and the silicon surface.

16. The LDMOS of claim 9 further comprising a deep trench isolation disposed to laterally surround the isolation ring.

17. The LDMOS of claim 9 further comprising a p-type implant disposed between the region of the FET and the isolation ring.

18. The LDMOS of claim 1 wherein the anode includes a portion capped by a silicide.

19. The LDMOS of claim 9 wherein the anode includes a portion capped by a silicide, the metal interconnect is connected to the silicide.

20. The LDMOS of claim 19 wherein the isolation ring includes a portion capped by a second silicide, the metal interconnect is connected to the second silicide.

* * * * *